United States Patent
Presting et al.

[11] Patent Number: 5,886,361
[45] Date of Patent: Mar. 23, 1999

[54] OPTOELECTRONIC COMPONENT HAVING A MODULATION-DOPED LAYER STRUCTURE

[75] Inventors: Hartmut Presting, Blaustein, Germany; Milan Jaros, New Castle upon Tyne, England

[73] Assignee: Daimler Benz AG, Stuttgart, Germany

[21] Appl. No.: 861,318

[22] Filed: May 21, 1997

[30] Foreign Application Priority Data

May 23, 1996 [DE] Germany .................. 196 20 761.4

[51] Int. Cl.[6] ...................... H01L 29/06; H01L 31/0328; H01L 31/0336
[52] U.S. Cl. .................. 257/17; 257/18; 257/21; 257/22; 257/184
[58] Field of Search .................. 257/21, 17, 18, 257/19, 22, 184

[56] References Cited

U.S. PATENT DOCUMENTS

| | | | |
|---|---|---|---|
| 4,772,924 | 9/1988 | Bean et al. | 257/19 |
| 4,843,439 | 6/1989 | Cheng | 357/4 |
| 5,313,073 | 5/1994 | Kuroda et al. | 257/18 |
| 5,646,421 | 7/1997 | Liu | 257/21 |

FOREIGN PATENT DOCUMENTS

| | | |
|---|---|---|
| 0393924 | 10/1990 | European Pat. Off. . |
| 0540235 | 5/1993 | European Pat. Off. . |
| 1952103 | 12/1995 | Germany . |

OTHER PUBLICATIONS

K.W. Gossen et al.: "Performance aspects of a quantum-well detector". In: J. Appl. Phys. 63, (10), May 15, 1988, pp. 5149–5153.

L.K. Orov et al.: "Photovoltaic effect in structures containing $Ge-Ge_{1-x}Si_x$ superlattices". In: Sov. Phys. Semicond. 22 (11), Nov. 1988, pp. 1262–1266.

Primary Examiner—William Mintel
Attorney, Agent, or Firm—Venable; George H. Spencer; Norman N. Kunitz

[57] ABSTRACT

A valence band quantum-well structure with a modulation doping for an optical-component implemented in Si technology. With this component, a high quantum efficiency and detection efficiency are accomplished. By way of spatial separation of the doped zone from the almost undoped SiGe quantum well, the Coulomb scattering and the recombination probability of the charge carriers drifting in the externally applied electrical field is greatly reduced at the doping material cores.

9 Claims, 1 Drawing Sheet

OPTOELECTRONIC COMPONENT HAVING A MODULATION-DOPED LAYER STRUCTURE

REFERENCE TO RELATED APPLICATIONS

This application claims the priority of German Patent Application No. 196 20 761.4, filed May 23, 1996, which is incorporated herein by reference.

BACKGROUND OF THE INVENTION

The invention relates to an optoelectronic component implemented in Si technology having a quantum-well structure with at least one pseudomorphously formed SiGe layer forming a quantum well in the valence band structure between layers made from Si and/or SiGe.

The invention is used, inter alia, for the production of infrared detectors using Si technology.

Known silicon/germanium infrared (IR) detectors are based on the principle of heterointernal photoemission (HIP; see, e. g., J. Lin et al., OPTICAL ENGINEERING, Vol. 33, p. 716, 1994; B. Y. Tsaur et al., OPTICAL ENGINEERING, Vol. 33, p. 72, 1994), In a highly p-doped ($p>5 \cdot 10^{20}$ cm$^{-3}$) SiGe layer, which is epitaxially grown on an undoped Si layer, the defect electrons (holes) disposed on the acceptor atoms are optically excited from the SiGe quantum well and transported towards the contacts by means of an externally applied electrical field and thus cause current to flow. However, these structures have several drawbacks because of the high doping of the SiGe wells. In particular:

a) for multiple quantum-well structures, the Coulomb scattering and recombination processes of the charge carriers previously photogenerated and drifting to the contacts are increased at the charged ion cores in the SiGe well, and thus, the efficiency of such multiple quantum-well structures is low due to the increased recombination probability;

b) the optical transition selection rules are cancelled in the SiGe well, thus, the optical excitations of the localized holes in the SiGe well have a relatively small oscillation strength; and, c) the epitaxial quality of the SiGe/Si hetero-interface is greatly impaired because of the high doping in the quantum well by boron diffusion and segregation.

Therefore, it is the object of the invention to provide an optoelectronic component with a quantum-well structure by means of which component a high quantum efficiency and thus detection sensitivity can be accomplished.

SUMMARY OF THE INVENTION

The above object is achieved according to the present invention by an optoelectronic component implemented in Si technology including a quantum-well structure with at least one pseudomorphously epitaxially formed SiGe layer forming a quantum-well in the valence band structure between layers made from Si and/or SiGe, and wherein the Si/SiGe layer sequence of the quantum well is modulation-doped, with the SiGe layer being substantially undoped. Advantageous features and/or modifications can be taken from the dependent claims.

The invention offers the advantage that for the valence band quantum-well structure according to the invention, the holes in the SiGe well are collected by way of spatial separation of the doped zone (doping spike) from the almost undoped SiGe quantum well (charge carrier channel) via charge transfer, for which a 100% ionization of the acceptor defects can be assumed. Due to the spatial separation of the holes from the acceptor atoms and due to the free charge carrier concentration (holes) in the SiGe channel, the Coulomb scattering and recombination probability of the charge carriers drifting in the externally applied electrical field is greatly reduced at the acceptor cores. This means that in an epitaxially stacked multiple quantum-well structure, the capture cross section of the photogenerated charge carriers in the further SiGe wells is much smaller during the transport towards the contacts and, thus, the efficiency of the detector is higher.

Based on the modulation-doped quantum-well structure, the probability of the excitation of charge carriers from the bound states into the continuum is increased because of the optical sum rule. This increases the quantum efficiency and the detector sensitivity.

In the following, the invention is explained in greater detail by way of an embodiment with reference to schematic drawings.

DETAILED DESCRIPTION OF THE PREFERRED EMBODIMENT

Figure 1:
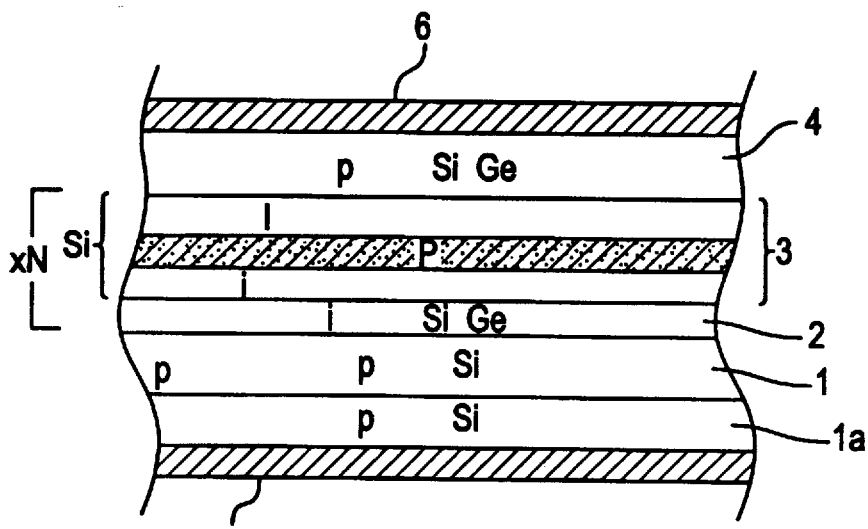
FIG. 1 schematically illustrates an exemplary layer sequence with the quantum-well structure according to the invention.

Referring now to FIG. 1, there is shown a Si substrate 1a, which is lightly p-doped and has a specific resistance of, e. g., 50 Ωcm. Pseudomorphouly epitaxially grown on the substrate 1a is a layer sequence of:

a p-doped Si layer 1 having a layer thickness of approximately 100 nm and a doping concentration of approximately $10^{16}$ cm$^{-3}$;

a quantum-well structure comprising an undoped or merely lightly doped ($p \leq 10^{16}$ cm$^{-3}$) Si$_{1-x}$Ge$_x$ layer 2 (e. g., x=0.3 to 0.5) having a layer thickness of approximately 5 nm and a highly doped thin Si layer 3, which has a spatially limited p-doping of approximately 5 nm and a doping concentration of $1 \cdot 10^{19}$ cm$^{-3}$–$1 \cdot 10^{20}$ cm$^{-3}$ (but possibly in the range of $5 \cdot 10^{17}$ cm$^{-3}$–$5 \cdot 10^{20}$ cm$^{-3}$) and which has an undoped zone of approximately 5 nm in width below the doped region, i.e., between the doped region and the interface with the layer 2, and an undoped zone of approximately 75 nm in width above the doped region; and, a p-doped SiGe layer 4 having a layer thickness of approximately 30 nm and a doping concentration of $1 \cdot 10^{20}$ cm$^{-3}$ on the upper undoped zone of the layer 3.

Figure 2:
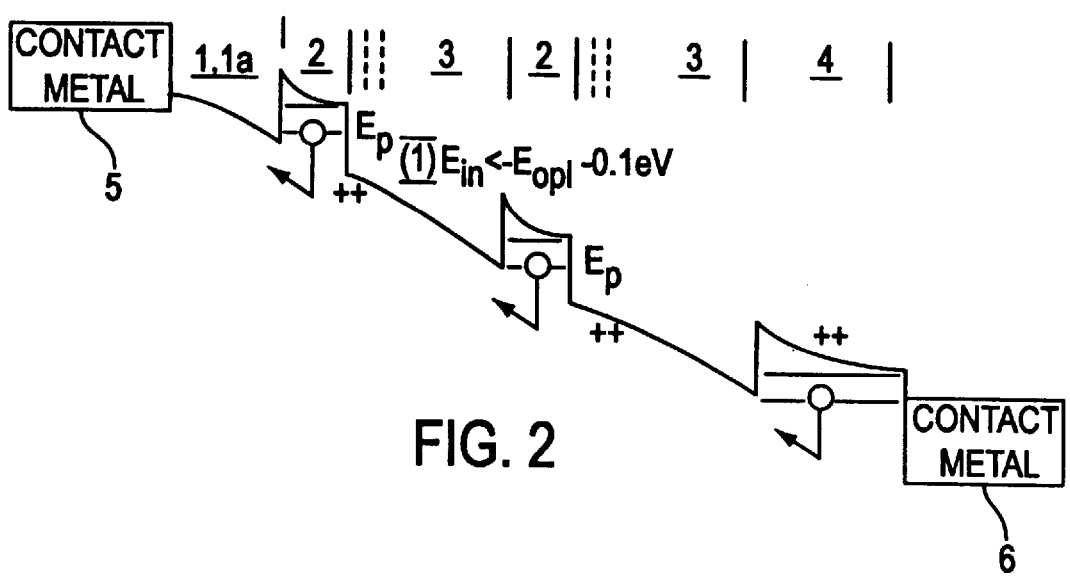
FIG. 2 schematically illustrates the course of the valance band edge of a modulation-doped quantum-well structure according to the invention.

Preferably several quantum wells may be formed by use of multiple deposition of the sequence of layers 2 and 3. FIG. 2 schematically illustrates the course of the valence band edge of a modulation-doped double quantum-well structure, i.e., a structure including two sequence of layers 2 and 3. For the above-cited structure, the optical barrier energy $E_{opt}$ is approximately 0.133 eV for a modulation doping of $p=1 \cdot 10^{19}$ cm$^{-3}$ and from this results a cutoff wavelength for, e. g., an IR detector, of approximately 12 µm.

By way of the thermal barrier energy $E_{therm}$, for which $E_{therm} \leq E_{opt}$ 0.1 eV applies in the present case, the thermionic dark current can also be determined. This dark current must be kept as small as possible in order to increase the sensitivity of the detector. For a double quantum-well structure according to FIG. 2 with a modulation doping of $p=1\cdot10^{19}$ cm$^{-3}$, the thermal barrier energy amounts to $E_{therm}=0.133$ eV which corresponds to a cutoff wavelength of approximately 12 µm.

The contacting of the optoelectronic component, e.g., of a heterointernal IR photodetector, having a structure according to FIG. 2 takes place via metal contacts 5 and 6 which are applied on the Si layer 1 and the SiGe layer 4, respectively, as indicated generally in the figures.

The invention now being fully described, it will be apparent to one of ordinary skill in the art that any changes and modifications can be made thereto without departing from the spirit or scope of the invention as set froth herein.

What is claimed:

1. An optoelectronic component in Si technology including a quantum-well structure with at least one pseudomorphously grown SiGe layer forming a quantum well in the valence band structure between layers made from Si or SiGe, and wherein a zone inside one of the Si or SiGe layers, which is adjacent the SiGe layer forming the quantum well, of the layer sequence of the quantum well structure is modulation-doped, with the SiGe layer forming the quantum well being substantially undoped.

2. An optoelectronic component according to claim 1, wherein the layer sequence is disposed on a silicon substrate and is comprised of at least a p-doped Si layer;

a substantially undoped SiGe layer disposed on the Si layer;

a modulation-doped Si layer disposed on the undoped SiGe layer; and, a p-doped SiGe layer disposed on the modulation doped Si layer.

3. An optoelectronic component according to claim 2, wherein the modulation doped Si layer has a spatially limited p-doping region of approximately 5 nm with a doping concentration between $5\cdot10^{17}$ cm$^{-3}$ and $5\cdot10^{20}$ cm$^{-3}$.

4. An optoelectronic component according to claim 3 wherein the modulation doped Si layer has a substantially undoped zone of approximately 5 nm between its doped region and its interface with the undoped SiGe layer, and a substantially undoped zone of approximately 75 nm between its doped region and its interface with the p-doped SiGe layer.

5. An optoelectronic component according to claim 2, wherein the quantum-well structure comprising the undoped SiGe layer and the modulation doped Si layer is formed n-fold in the layer sequence.

6. An optoelectronic component according to claim 5, wherein the layer sequence comprises a double quantum-well structure.

7. An optoelectronic component according to claim 5 further comprising respective metal contacts for said substrate layer and for said p-doped SiGe layer.

8. An optoelectronic component according to claim 5 wherein the p-doped Si layer has a layer thickness of approximately 30 nm and a doping concentration of approximately $10^{16}$ cm$^{-3}$, and the p-doped SiGe layer has a layer thickness of approximately 30 nm and a doping concentration of $$1\cdot10^{20} \text{ cm}^{-3}.$$

9. An optoelectronic component according to claim 5 for producing an IR detector, wherein the optical barrier energy of the detector amounts to $E_{pot}\approx0.133$ eV and that the detector has a cutoff wavelength of approximately 12 µm and is an IR detector.

* * * * *